United States Patent [19]

Boenning

[11] Patent Number: 5,422,566
[45] Date of Patent: Jun. 6, 1995

[54] APPARATUS AND METHOD FOR SENSING DC CURRENT IN A CONDUCTOR

[75] Inventor: Robert A. Boenning, Timonium, Md.

[73] Assignee: Westinghouse Electric Corporation, Pittsburgh, Pa.

[21] Appl. No.: 69,487

[22] Filed: Jun. 1, 1993

[51] Int. Cl.⁶ .............................. G01R 33/02
[52] U.S. Cl. ................. 324/117 R; 324/126
[58] Field of Search ......... 324/117 R, 117 H, 244.1, 324/126, 127, 252, 226, 146, 151 R, 260, 226, 244; 338/2; 73/760, 763, 767, 774, 779

[56] References Cited

U.S. PATENT DOCUMENTS

| | | | |
|---|---|---|---|
| 3,801,908 | 4/1974 | Van Ardel | 324/117 R |
| 4,232,265 | 11/1980 | Smirnov | 324/117 |
| 4,727,321 | 2/1988 | Hüschelrath | 324/226 |
| 4,841,235 | 6/1989 | Hartings et al. | 324/117 R |
| 4,848,146 | 7/1989 | Bruno et al. | 73/181 |
| 4,866,383 | 9/1989 | Taliaferro | 324/226 |
| 4,937,521 | 6/1990 | Yoshino et al. | 324/117 R |
| 5,221,894 | 6/1993 | Herwig | 324/117 R |

FOREIGN PATENT DOCUMENTS 4021358 1/1992 Germany.

Primary Examiner—Vinh Nguyen

[57] ABSTRACT

A non-contact DC current sensor has a housing in which a pair of cantilevered compliant armatures are mounted. In one embodiment, a single magnet is mounted to a free end of one armature portion, and a nonmagnetic mass of the same moment and weight is mounted at the free end of the other armature to compensate for gravitational forces. Strain gages are mounted adjacent the magnet and the nonmagnetic mass on the pair of armatures. The strain gages are connected in a circuit to generate an output caused by a Lorentz force. The circuit includes provision for static gravity compensation, and in one embodiment 1/r compensation.

20 Claims, 5 Drawing Sheets

APPARATUS AND METHOD FOR SENSING DC CURRENT IN A CONDUCTOR

BACKGROUND OF THE INVENTION

1. Field of Invention

The present invention relates to current sensing; and more particularly, to a method and apparatus for sensing electrical current in a conductor.

Although the present invention is subject to a wide range of applications, it is especially suited for use in sensing the current in conventional or electric vehicles, and will be particularly described in that connection.

2. Discussion of Related Art lo Presently, for certain applications, Hall Effect devices are used to measure the DC current in conductors. These devices develop a DC voltage due to a DC current in a current carrying conductor placed in a magnetic field. The conductor is positioned so that the magnetic field is perpendicular to the direction of current flow and the electric field that creates the DC voltage is perpendicular to both. However, Hall effect sensors are costly and exhibit non-linearity over extreme temperature ranges.

Also, for certain applications involving high current, such as automotive battery and alternator cables, a precision low resistance is placed in series with the conductor. This resistance provides a voltage drop proportional to the conductor current that can then be used as an input to an engine control computer for power train optimization. A disadvantage is that the cable must be broken to insert the low resistance, resulting in a special assembly and potential long-term connection reliability problems. Additionally, this arrangement is not electrically isolated from the primary circuit and is prone to noise problems.

In light of the foregoing, particularly for sensing DC current in conductors, such as battery or alternator cables of motor vehicles, there is a need for a low cost, easily installed, reliable current sensing device that does not require a special cable assembly, is isolated from the primary electrical system, and is linear over a wide range of temperatures.

SUMMARY OF INVENTION

Accordingly, the present invention is directed to an apparatus and method for sensing current in a conductor that substantially obviates one or more of the limitations and disadvantages of the described prior apparatus.

Additional features and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve these and other advantages and in accordance with the purpose of the invention as embodied and broadly described herein, the invention is an apparatus for sensing DC current in a conductor, that has a housing; a conductor; and an armature mounted to the housing at a predetermined location. The armature has a compliant portion spaced from the predetermined mounting location; with a permanent magnet mounted to the armature at the compliant portion of the armature. One or more strain gages are mounted to the armature intermediate the predetermined mounting location and the magnet, the strain gages have electrical characteristics that vary in accordance with the deflection of the armature. Circuit means, including the strain gages, are provided for generating a voltage having a value corresponding to the electrical characteristics of the corresponding strain gage; and means for mounting the base to the conductor with the magnet being adjacent to and spaced from the conductor to move the armature in response to the Lorentz force created by the current in the conductor.

In another aspect, the invention includes a method of sensing current in a conductor, comprising suspending a magnet adjacent a free end of a compliant cantilevered armature; fixing the cantilevered end of the armature at a location relative to the conductor to position the conductor in the flux field of the magnet; sensing a change in position of the magnet relative to the conductor caused by the Lorentz force; and converting the sensed change in position to an output voltage corresponding to the current in the conductor.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

DETAILED DESCRIPTION

Figure 1:
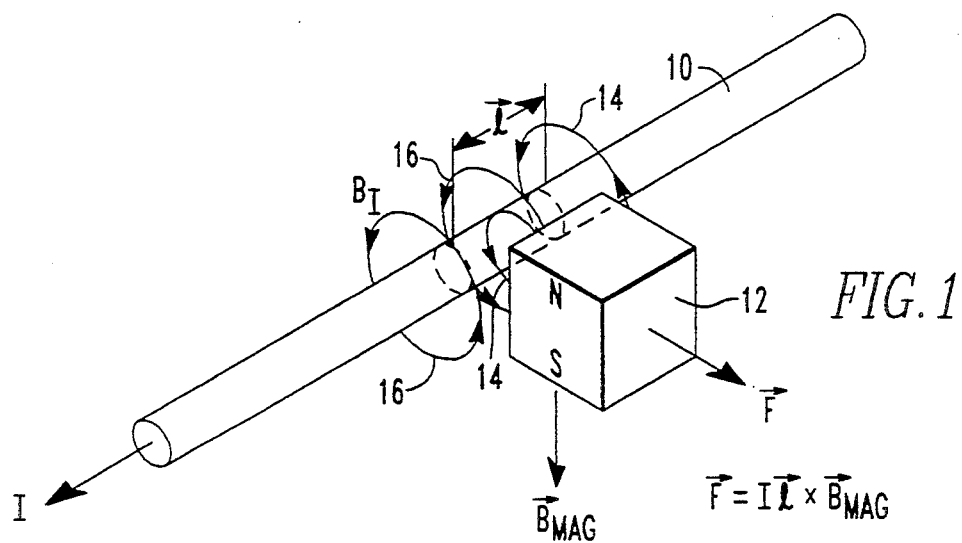
FIG. 1 is a diagram illustrating the principles of a first embodiment of the present invention.

Reference will now be made in detail to the present exemplary embodiments of the invention which are illustrated in the accompanying drawings. Whenever possible, the same reference numbers will be used throughout the drawings to refer to the same or like parts.

The present invention is based upon the measurement of the well known Lorentz force. Lorentz force is that force on a charged particle moving in electric and magnetic fields, which is equal to the charge of the particle times the sum of the electric field and the cross product of the particle's velocity and the magnetic flux density. To better understand this principle in connection with the present invention, reference is made to FIG. 1 wherein a conductor 10 is conducting a current I. A magnet 12 is positioned adjacent the conductor so that the direction of magnetic field B is normal to the direction of current I in the conductor 10. The field of the magnet 12, represented by arcuate lines 14, interacts with the circular electrical field represented by arcuate lines 16 surrounding the current carrying conductor. This produces a force F on the magnet 12 in a direction normal to both the direction of the current I and the direction of the magnetic field B. While F is normally considered to be the force on the current carrying conductor in a fixed magnetic field B, it can also be considered the force on the magnet 12 producing B, provided the conductor is fixed, and stays within B as the magnet moves. This force corresponds to the current in the conductor I over a length l of the conductor in which flux density due to the magnet, referred to as 12, is constant, times the flux density. The length over which the flux density B, due to the magnet, is constant is essentially that distance corresponding to the width of the magnet 12 along the axis of the conductor 10.

The apparatus for sensing current in a conductor having a longitudinal axis comprises a housing having means for mounting the device to conductor 10. As embodied herein, a housing 18 has opposite end pieces 20, each of which has an open slot 22 for receiving the current carrying conductor 10. A side cover 24 encloses the slots 22 for affixing the housing to the conductor. Housing 18 has a bottom 28 for supporting a circuit, and a side panel 30 opposite the side covers A top cover (not shown) may complete the housing enclosure. If desired, the top cover can seal the housing to include a viscous damping fluid to prevent undesirable motion of the armature due to vibration and/or shock. Mounted to the housing 18 is an alignment plate 32 having a support 34 mounted intermediate the ends of the plate. Alignment plate 32 is fastened at opposite ends to end panels 20 and 22 adjacent slots 22 for maintaining the conductor in alignment along its length and for supporting an armature (hereinafter described). The housing 18 may be made of any non-ferrous material such as aluminum or a molded polymer, for example. Also, the housing 18 may take many different forms and methods of attachment to the conductor depending on the particular application and its location along a conductor.

In accordance with the present invention, an armature is mounted to the housing at a predetermined location. As herein embodied, an armature 40 is attached to support member 34 by two screws 42 midway between opposite ends of the armature. Armature. 40 may be a thin piece of material, which preferably has low mechanical hysteresis, high linearity, and a low modulus of elasticity. One material known to meet these criteria is an aluminum alloy known as 2024-T81. The armature 40 can be micro-minature in size, and is preferably a thin rectangular strip capable of compliance with a Lorentz force in opposite directions, in one plane which plane is normal to the longitudinal axis of the conductor. Additionally, the entire current sensor could be implemented on a monolithic substrate using micromachining techniques for the armature structure and conventional integrated circuit technology for the electronics.

In accordance with the invention, a magnet is mounted to the armature at a compliant portion of the armature. As herein embodied and referring to the embodiment of FIG. 2, a permanent magnet 12, preferably made of neodymium-iron-boron is attached to one free end of the armature 40. The neodymium iron-boron magnet referred to herein is known as a "rare earth" magnet; and has a peak energy density and coercivity that is approximately six and fourteen times higher, respectively, than Alnico 5. The high coercivity permits the magnets to be made in the shape of rectangular blocks that can be sized to provide the uniform B field required by the sensor.

A nonmagnetic compensating mass 44, such as brass, for example, is attached to an opposite free end 46 of the armature 40 such that its mass is symmetrically located with respect to the longitudinal axis of the armature. A portion 41 of the armature 40 between an adjacent mounting screw 42 and including the magnet 12 is similar in dimension, configuration and weight as a portion 43 of the armature 40 between adjacent mounting screw 42 and including the nonmagnetic compensating mass 44. In other words, each of the unsupported extensions 41 and 43 of armature 40 is mechanically equivalent to the other. Although one armature 40 is shown fastened midway between its ends, two mechanically equivalent armatures may be used that are fastened to the supporting member 34 adjacent respective ends. The armature portion that includes brass mass 44 provides static gravity compensation for the portion of the armature that includes the rectangular magnet for all oriented positions of the sensor.

In accordance with the present invention, a strain gage is mounted to the armature intermediate the predetermined mounting location and the permanent magnet. As herein embodied and again referring to FIG. 2, a first piezoresistive strain gage 50 is mounted to the armature 40 between screw 34 in portion 41 of the armature, and the magnet 12 on one surface of the armature; and a second similar strain gage 52 is mounted on the armature portion 41 on a surface opposite the strain gage 50. A third piezoresistive strain gage 54 is mounted on the armature portion 43 between the brass weight 44 and the screws 42 in the same position as the strain gage 50 on one surface of the armature 40; and a fourth piezoresistive strain gage 56 is mounted on the reverse surface of the armature 40 similar to the strain gage 54. Since the strain gages are matched and preferably attached to a common aluminum member 40, their resistances will change together with temperature as well as gravity. The mounting of the four strain gages on the armature 40 has the advantage of doubling the output of the bridge for the same applied force, and reducing amplifier gain by a factor of two.

Figure 2:
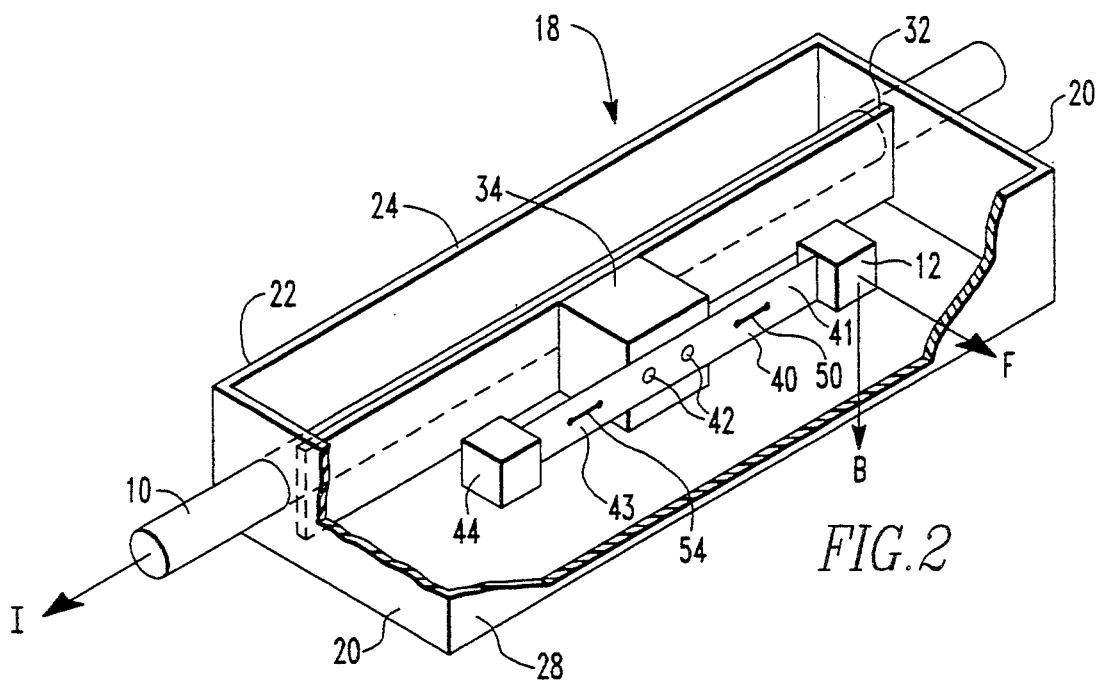
FIG. 2 is a view in perspective partly broken away of one embodiment of the invention mounted on an electrical conductor.
Figure 2A:
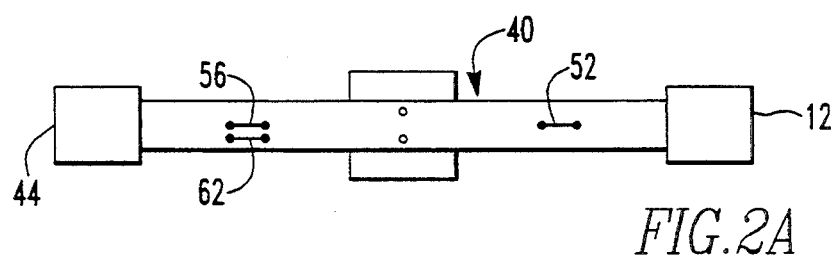
FIG. 2A is a fragmentary view of a reverse side of the armature of FIGS. 2 and 3 illustrating the mounting of strain gages.
Figure 3:
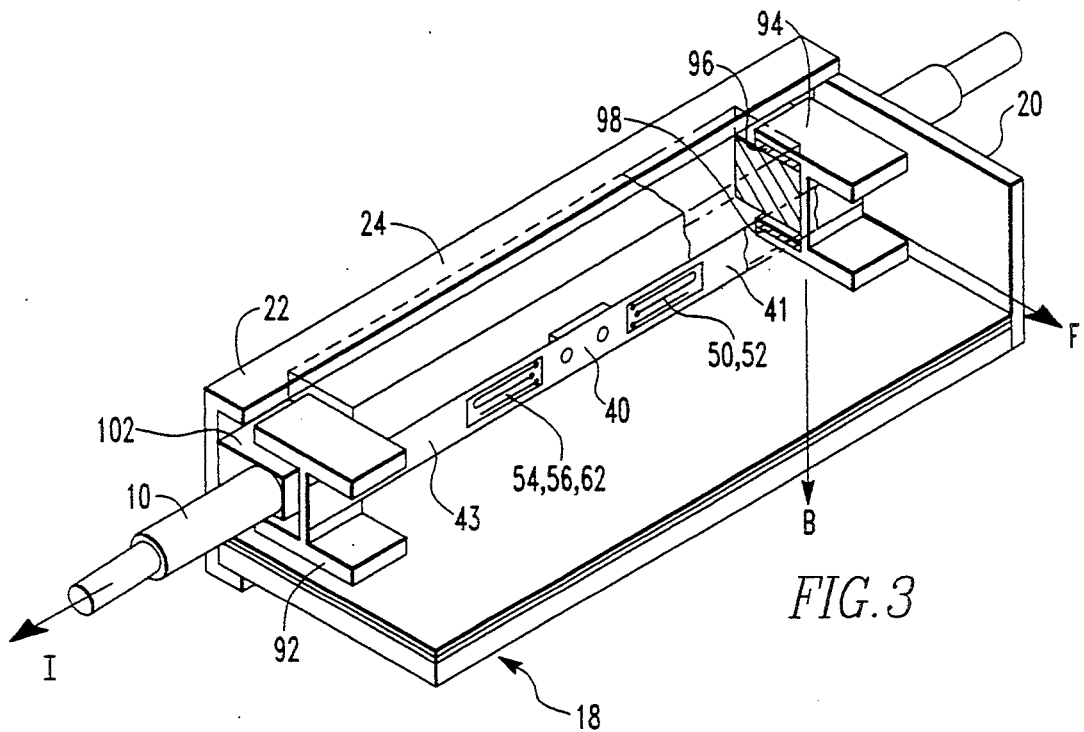
FIG. 3 is a view in perspective, partly broken away, of a second embodiment of the invention mounted on an electrical conductor.
Figure 3A:
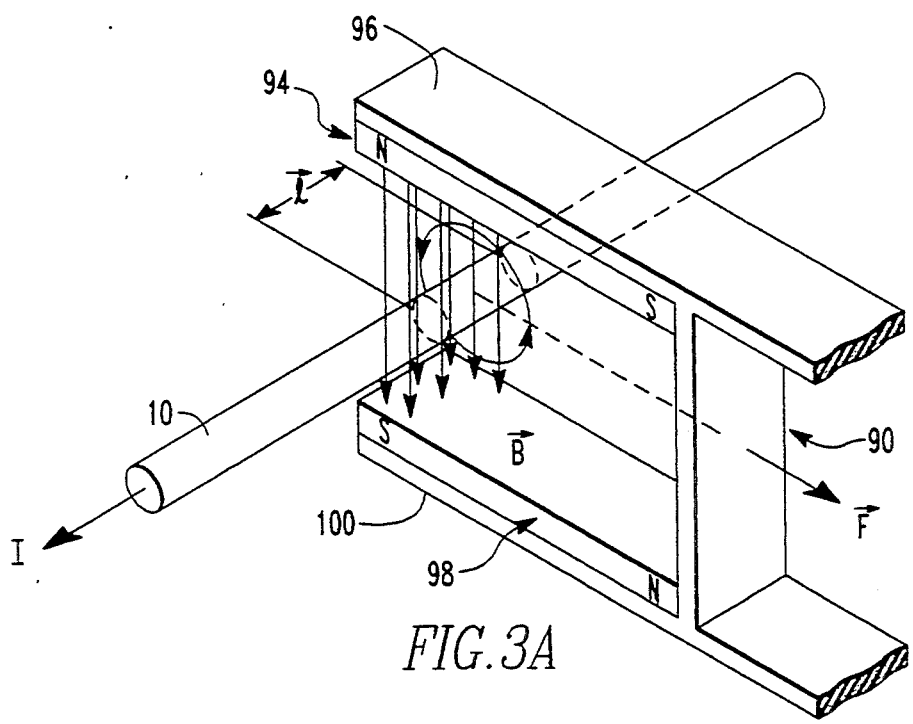
FIG. 3A is a diagram illustrating the principles of a second embodiment of the present invention.

Referring to FIG. 3, a second embodiment of the apparatus of the present invention is illustrated which is similar to the embodiment of FIG. 2, except that two magnets are mounted on a yoke 90 of high permeability material, above and below the current carrying conductor 10 to create a magnetic field through the current carrying conductor 10 that is essentially uniform. Referring to FIG. 3A, this arrangement of the magnets provides an essentially uniform field B through the current carrying conductor 10 over a distance l, and eliminates the decrease in the Lorentz force F as the armature moves away from current carrying conductor 10. In the portion 41 of the armature to which is attached the U-shaped member 90, a first magnet 94, similar in configuration and composition to magnet 12 of FIGS. 1 and 2 is inserted between an upper leg 96 of the member 90 and the conductor 10, and a second magnet 98 is inserted between the conductor 10 and a lower leg 100 of the member 90. The magnets 96 and 98 are spaced from conductor 10, so that the armature 40 can fully comply with a Lorentz force corresponding to one hundred amperes with the conductor remaining in the magnetic flux field. Static balance about the longitudinal axis of the armature is provided by the H-shaped members 90 and 92. Masses, equal in weight and size to the magnet structure 90 and position compensation structure 92, mounted symmetrically about the longitudinal axis of the armature result in a zero net moment about this axis for all positions. Consequently, rotation of the sensor about the longitudinal axis of the armature will not result in bridge imbalance due to strain in the armature caused by twisting.

Surrounding the conductor 10 at the opposite free end of the armature 40 is a U-shaped nonmagnetic position compensation mass 92. Rectangular nonmagnetic block 102 surrounding conductor 10 slidably fits between the upper and lower legs of the U-shaped member 92 similar to the magnets 96 and 98. The remaining apparatus is similar to that described in connection with FIG. 2. The strain gages 50, 52, 54 and 56 are similar to those described in connection with the first embodiment. Similar to the first embodiment of the present invention, strain gages 50 and 52 may be placed on opposite plane surfaces of the magnet armature portion 41 and gages 54 and 56 may be placed on opposite surfaces of the non-magnet armature portion 43 of armature 40. The Lorentz force F due to current in conductor 10 for this embodiment is independent of magnet position as long as the current carrying conductor remains in the uniform field B. Consequently, the need for 1/r compensation employed with the first embodiment is eliminated.

In accordance with the invention, the sensor includes a circuit means including the four strain gages for generating an output signal having a value that is a function of the electrical characteristics of the strain gages. As herein embodied; and referring to FIGS. 4, and 5, the four strain gages 50, 52, 54, and 56 form the legs of a well known resistive or Wheatstone Bridge. The two strain gages 50 and 52 on opposite surfaces of the magnet portion of the armature form two adjacent legs of the bridge; and the two strain gages 54 and 56 on opposite surfaces of the portion of the armature adjacent the nonmagnetic mass 44 form the other two adjacent legs of the bridge.

In operation, both armature portions 41 and 43 are subject to equal gravity forces and the bridge remains balanced for all positions of the armature. However, the magnet portion 41 of the armature 40 is also subjected to the Lorentz force due to the interaction of the electrical and magnetic fields as heretofore discussed.

Figure 4:
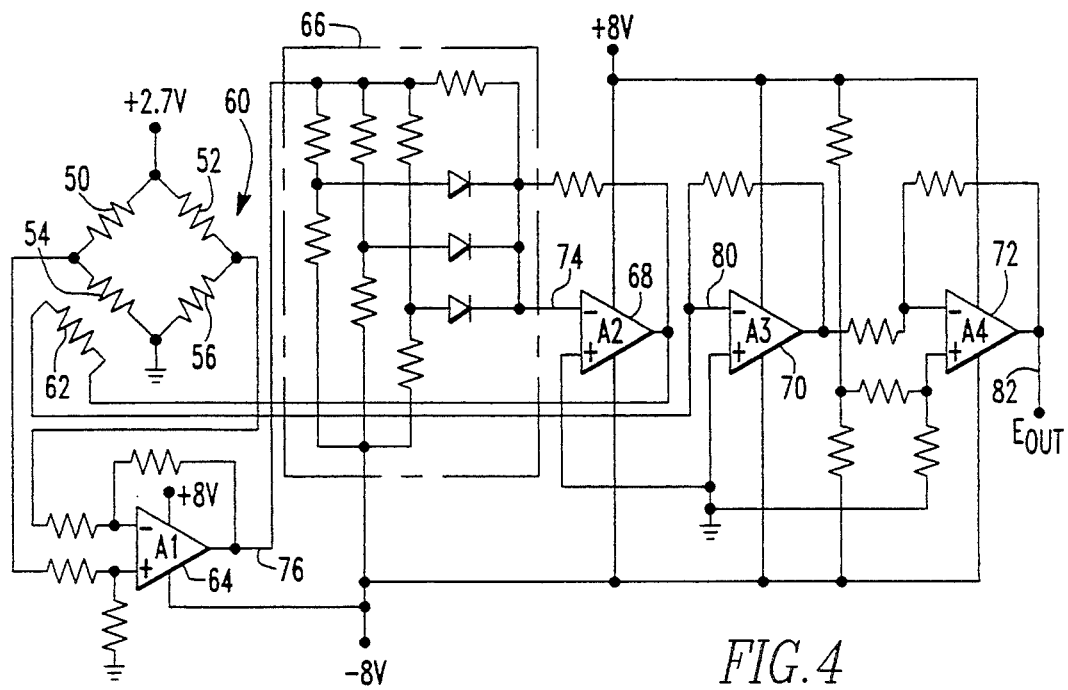
FIG. 4 is a schematic diagram of the circuit for the embodiment of FIG. 2 in accordance with the present invention.
Figure 5:
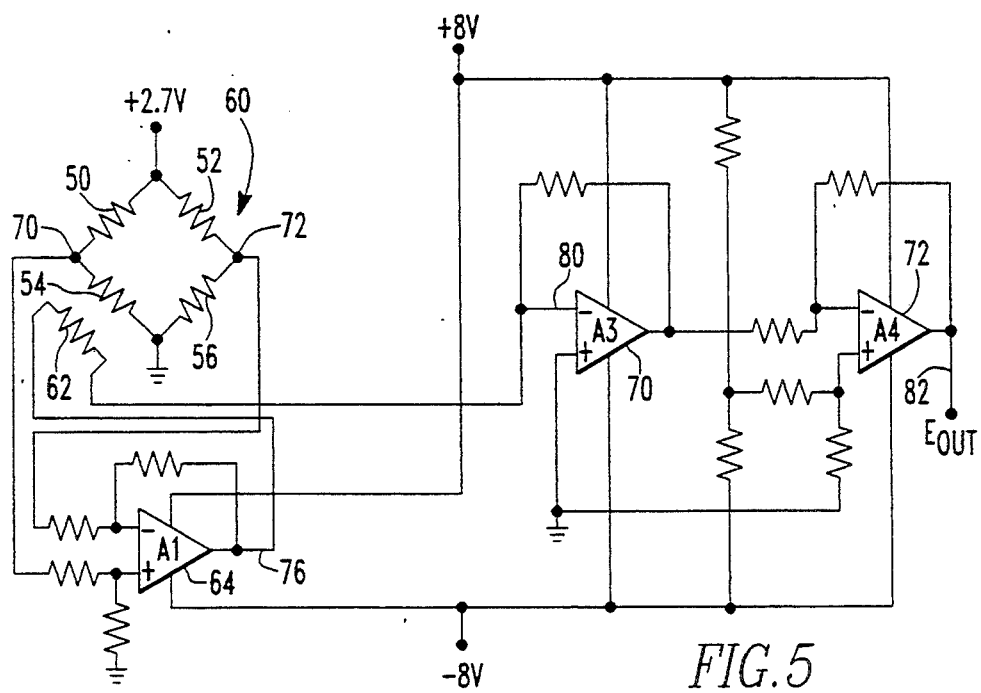
FIG. 5 is a schematic diagram of a circuits for the embodiment of FIG. 3 in accordance with the present invention.

Referring to FIGS. 4 and 5 and as herein embodied, the circuit means includes the resistor bridge 60, including the four strain gages as previously discussed, a static gravity compensation strain gage 62 which is preferably located on the armature portion 43 adjacent the brass mass 44, a scaling amplifier 64, a resistor diode network 66, and operational amplifiers 68, 70, and 72.

When the field of magnet 12, B, of armature 40 couples with the magnetic field surrounding the current carrying conductor 10 due to the current I, the magnet 12 experiences a force F in a direction normal to both I and B. This force F causes armature 40 to deflect in the direction of F by an amount that is proportional to the magnitude of current I. This deflection, in turn, results in a compressive strain on strain gage 50, and a tensile strain of equal magnitude on strain gage 52. The result is a decrease in the resistance of strain gage 50 that is proportional to the compressive strain, and an increase in the resistance of strain gage 52 that is proportional to the tensile strain. As a consequence, the voltage at junction 70 of the resistance bridge increases, while the voltage at junction 72 decreases by an equal amount. Thus, this voltage difference is proportional to the magnitude of current I in conductor 10.

If B is considered to be due to $I_1$ in an adjacent conductor instead of the permanent magnet spaced a distance r from the center of the conductor carrying I, then $$F = Il \frac{I_1 \mu}{2 \pi r} \quad F = Il \frac{I_1 \mu}{2 \pi r}$$

where $$\frac{I_1 \mu}{2 \pi r} = B$$

It can be seen that for large values of I, the force per unit length, l, will decrease by a factor of 1/r as the adjacent conductor, or permanent magnet in this case, moves away from the conductor carrying I, due to the decrease in B with increasing r. Compensation for increasing r is provided by resistor-diode network 66 and operational amplifier 68.

Operational amplifier 68 has an input 74 connected to the output of the resistor diode network 66. The network 66 of FIG. 4 and operational amplifier 68 compensate for the decreasing force per unit of current I when measuring large values in the one hundred ampere range. An input of the network 66 is connected to output 76 of the scaling amplifier 64. The output 76 of the scaling amplifier corresponds to the voltage across the bridge 60 at 70 and 72 multiplied by gain A1. This output is modified by progressively increasing the gain of the operational amplifier 68 as the output of amplifier 64 increases with increasing current I. The result is an output at 78 from operational amplifier 68 that is essentially linear over a measurement range of one to one hundred amperes.

As previously mentioned, the strain gage 62 provides static gravity compensation. When the plane of the armature 40 is other than vertical, gravity will either add to or subtract from the actual Lorentz force, causing the indicated current to be recorded as slightly higher or lower than the actual value. Strain gage 62, which provides the input resistance to operational amplifier 70 is connected between the output 78 of the network 66 and the operational amplifier 68, and an input 80 of the operational amplifier 70. The amplifier 70 has a gain of one when the strain gage 62 provides a resistance corresponding to a vertical position of the plane of the armature. Any deviation from vertical changes the strain gage resistance slightly either plus or minus, causing the amplifier 70 gain to change and, thus, compensate for the force of gravity. Operational amplifier 72 inverts the output of operational amplifier 70 and shifts its level such that the sensing of a current in conductor 10 of one hundred amperes provides an output at 82 of zero volts, and such output at 82 substantially linearly increases as the current decreases in the conductor to zero amperes.

Referring to FIG. 5, the circuit means for the second embodiment of the invention is similar to FIG. 4, as previously described except that it does not include a provision for 1/R compensation corresponding to the resistor diode network 66.

Figure 6:
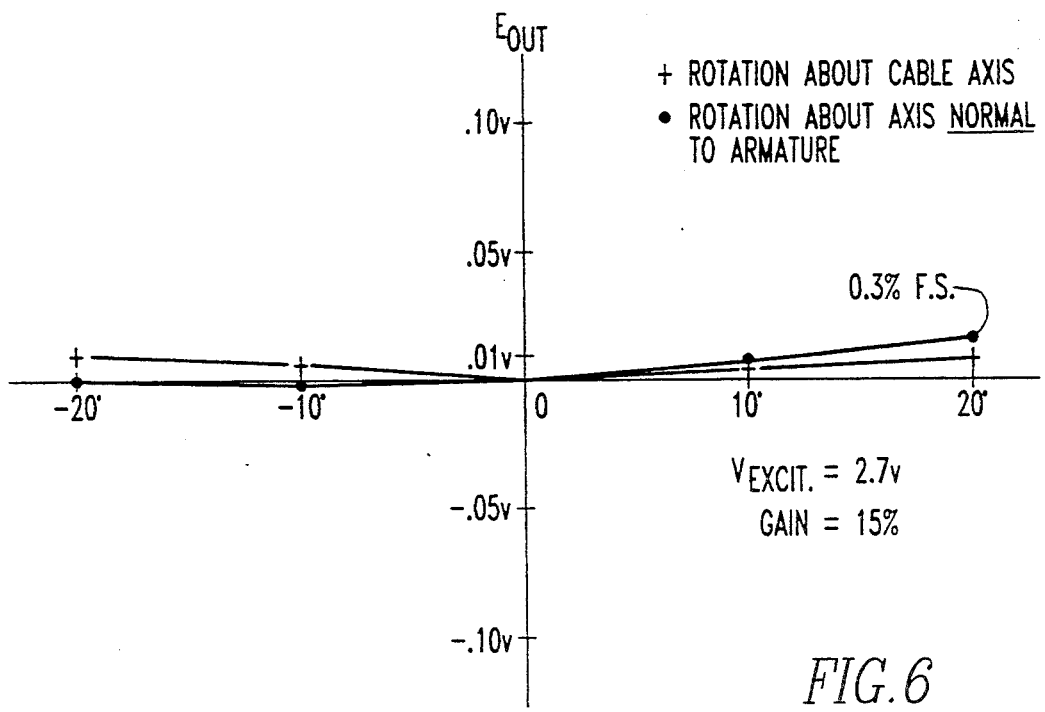
FIG. 6 is a diagram illustrating the relationship between output voltage and the orientation of the device of FIG. 2 about a horizontal axis normal to the armature plane.
Figure 7:
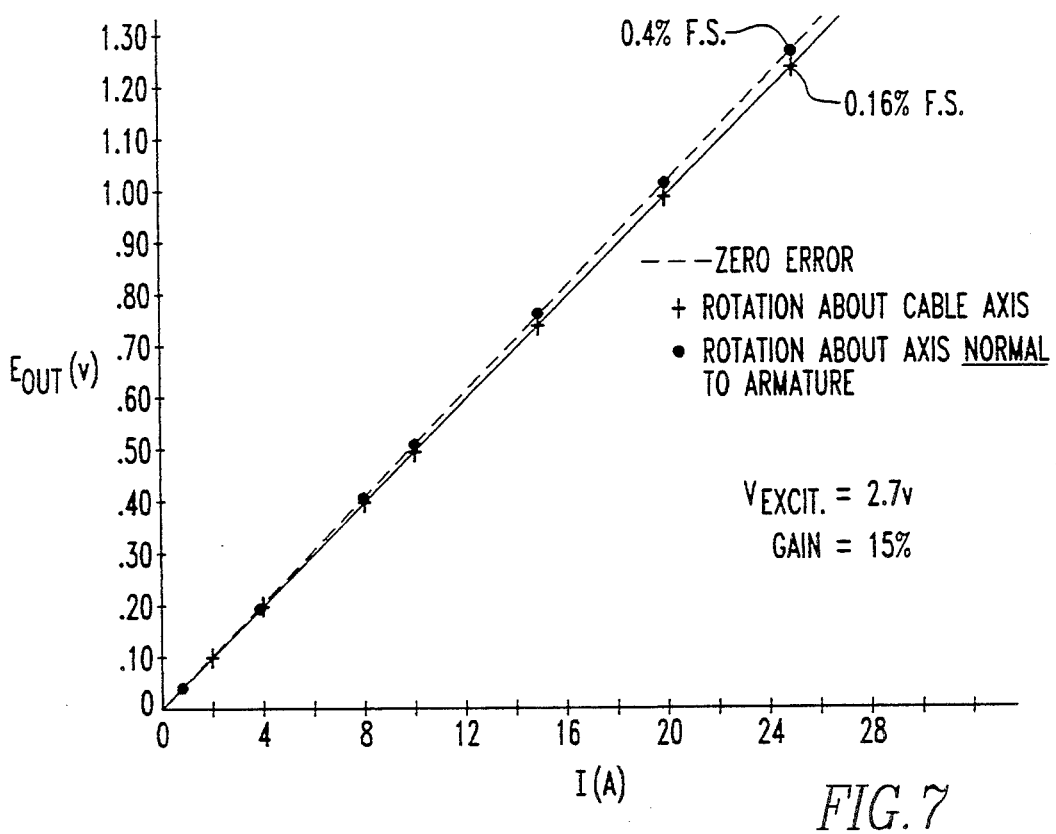
FIG. 7 is a diagram illustrating the operation of the device over a range of zero to twenty-five amperes with the plane of the armature of the embodiment of FIG. 2 horizontal.
Figure 8:
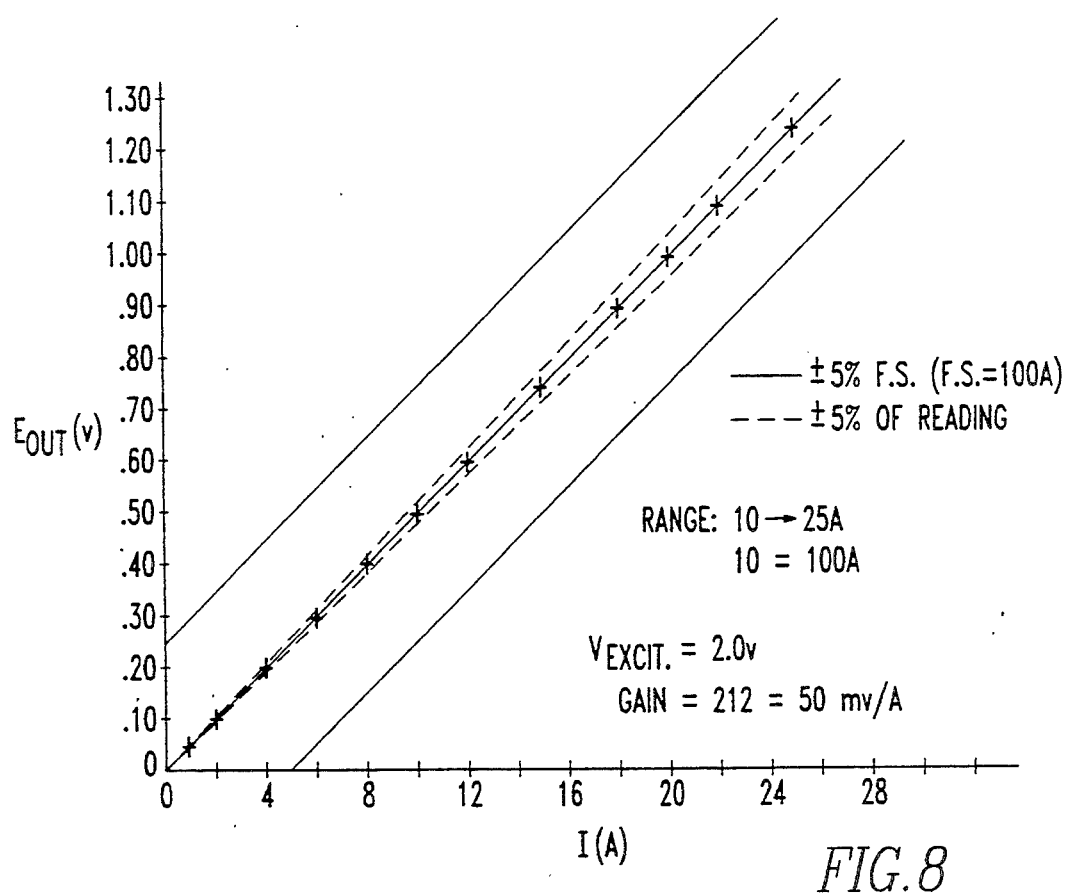
FIG. 8 is a diagram illustrating the operation of the device over a range of zero to twenty-five amperes with the plane of the armature of the embodiment of FIG. 2 vertical.

FIGS. 6, 7, and 8 illustrate the results of measurements made using a prototype of the current sensor FIG. 2. DC current was limited to 25 amperes with the available power supply and adjustable load. Output voltage $e_{out}$ is the output of the scaling amplifier, 64 in all cases.

FIG. 6 shows $e_{out}$ VS. current I with the sensor in the normal position, i.e., the plane of the armature vertical. Response is almost perfectly linear from one to twenty-five amperes. FIG. 7 shows the response with the armature plane horizontal which is the worst case for gravity effect. Error is 0.4% F.S. at twenty-five amperes for gravity aiding $F_1$, and −0.16% F.S. for gravity opposing $F_{11}$. FIG. 8 illustrates the change of $e_{out}$ as a function of rotation of the sensor about the cable axis and about the centerline normal to the plane of the armatures with I=O. This change of $e_{out}$ is the shift in the bridge null due to gravity caused by slight mechanical and electrical differences between the two armatures. With a monolithic embodiment, these differences would be minimal and could be expected to result in no more than 0.1% full scale error.

Having described the presently preferred system embodiments and method of the invention, additional advantages and modifications will readily occur to those skilled in the art. Accordingly, the invention in its broader aspects is not limited to specific details, representatives apparatus, and illustrative examples shown and described. Departure may be made from such details without departing the spirit or scope of the general inventive concept as defined by the appended claims and their equivalents.

What is claimed is:

1. An apparatus for sensing current in a conductor, comprising:
    a housing
    an armature mounted to the housing at a predetermined mounting location, said armature having a compliant portion spaced from the predetermined mounting location;
    a permanent magnet mounted to the armature at the compliant portion of the armature, the permanent magnet being adjacent to and spaced from the conductor to deflect the armature in response to a Lorentz force created by the current in the conductor;
    a first strain gage mounted to the armature intermediate the predetermined mounting location and the permanent magnet, the strain gage having electrical characteristics that vary in accordance with the deflection of the armature; and
    circuit means including the strain gage for generating a voltage having a value proportional the current in the conductor.

2. The apparatus of claim 1 wherein the permanent magnet is comprised of a rare earth material.

3. The apparatus of claim 1 wherein the armature is comprised of a metallic material.

4. The apparatus of claim 1 wherein the armature is mounted to the housing intermediate its ends; and the permanent magnet is mounted adjacent one end of the armature; and
    wherein the apparatus further comprises a non-ferrous mass mounted adjacent an opposite end of the armature to compensate for any deflection of the permanent magnet caused by gravitational forces.

5. The apparatus of claim 4 wherein the nonmagnetic mass and the permanent magnet have a similar configuration and dimension to maintain untwisted balanced movement of the armature.

6. The apparatus of claim 1 wherein the armature is a thin metallic strip having opposite planar surfaces, and the apparatus further comprises additional strain gages mounted to the opposite planar surfaces of the armature.

7. The apparatus of claim 1 wherein the circuit means comprises a resistance bridge having the first strain gage forming at least one leg of the bridge, said bridge having an output for generating a voltage corresponding to the force exerted on the at least one magnet by the Lorentz force.

8. The apparatus of claim 7 wherein the circuit means comprises a first operational amplifier responsive to the generated voltage of the bridge for generating an output voltage having a value corresponding to the deflection of the armature relative the conductor; a second strain gage being mounted to the armature, and having an output independent of the first strain gage; a second operational amplifier having an input coupled to an output of the first operational amplifier with said second strain gage being connected in series between the output of the first operational amplifier and the input of the second operational amplifier, for providing gravity compensation to the Lorentz force.

9. The apparatus of claim 1 wherein the circuit means includes a resistor diode network to compensate for a decrease in force as the permanent magnet moves away from the current carrying conductor.

10. An apparatus for sensing current in a conductor, comprising:
    a housing;
    a compliant armature mounted to the housing at a mounting location intermediate first and second opposite ends of the armature;
    a first permanent magnet fixedly mounted to the armature adjacent the first opposite end, the permanent magnet being adjacent to and spaced from the conductor to deflect the armature relative to the conductor in response to a Lorentz force created by current in the conductor;
    a nonmagnetic mass fixedly mounted to the armature adjacent the second opposite end;
    the permanent magnet and the nonmagnetic mass being movable relative to the conductor in accordance with gravitational forces;
    a first strain gage mounted to the armature between the mounting location and the first opposite end;
    a second strain gage mounted to the armature between the mounting location and the second opposite end; and
    circuit means including the first and second strain gages for generating a voltage having a value corresponding to the deflection of the permanent magnet and the nonmagnetic mass relative to conductor, less a voltage having a value contributed by gravitational forces resulting in an output voltage having a value proportional to the current in the conductor.

11. The apparatus of claim 10 further comprising:

a third strain gage and a fourth strain gage mounted to the armature between the mounting location and the respective first and second opposite ends;

a fifth strain gage mounted to the armature between the mounting location and the second opposite end; and wherein the circuit means includes a resistance bridge with each leg including one of the first, second, third, and fourth strain gages, and a static gravity compensation circuit including the fifth strain gage for compensating for deflection of the armature caused by gravitational forces.

12. The apparatus of claim 10 further comprising a second permanent magnet, the first and second permanent magnets spaced from one another on diametrically opposite sides of the conductor; and a ferrous yoke holding the permanent magnets in position.

13. The apparatus of claim 10 wherein the magnet includes a rare earth permanent magnet.

14. A method of sensing current in a conductor comprising, providing a compliant cantilevered armature suspending a permanent magnet adjacent a first free end of said compliant cantilevered armature;

fixing the cantilevered end of the armature at a location relative to the conductor to position the conductor in the flux field of the magnet;

sensing a change in position of the permanent magnet relative to the conductor caused by a Lorentz force; and converting the sensed change in position to an output voltage having a value corresponding to the current in the conductor.

15. The method of claim 14 wherein the step of sensing a change in position comprises detecting a change in resistance resulting from the deflection of the armature by the Lorentz force.

16. The method of claim 14 wherein the sensing of the change in position further comprises suspending a nonmagnetic mass adjacent to a second the free end of said cantilevered armature fixed relative to the conductor and the suspended magnet, sensing a change in position of the nonmagnetic mass caused by gravity; and algebraically adding the sensed change in position of the magnet and nonmagnetic mass.

17. The method of claim 14 wherein the step of converting the change in position to an output voltage comprises, detecting resistance in adjacent legs of a bridge circuit in accordance with gravity and the Lorentz force; and generating an output voltage corresponding to the resistance.

18. The method of claim 14 wherein the step of suspending the permanent magnet, comprises suspending a rare earth magnet.

19. The method of claim 18 wherein the step of suspending the permanent magnet comprises attaching a high permeability iron yoke having spaced legs to said first free end of the armature, and mounting a first and a second permanent magnet to the spaced legs for providing an essentially uniform field through the current carrying conductor over the range of displacement of the yoke.

20. The method of claim 14 wherein the step of connecting the sensed change of position includes utilizing a resistor diode network to maintain the voltage output signal proportional to current in the conductor over a range of approximately one hundred amperes.

* * * * *